(12) United States Patent
Goran et al.

(10) Patent No.: US 11,087,953 B2
(45) Date of Patent: Aug. 10, 2021

(54) MOVEABLE DETECTOR

(71) Applicant: Bruker Nano GmbH, Berlin (DE)

(72) Inventors: Daniel Goran, Berlin (DE); Waldemar Hahn, Berlin (DE)

(73) Assignee: Bruker Nano GmbH, Berlin (DE)

( * ) Notice: Subject to any disclaimer, the term of this patent is extended or adjusted under 35 U.S.C. 154(b) by 0 days.

(21) Appl. No.: 16/661,146

(22) Filed: Oct. 23, 2019

(65) Prior Publication Data

US 2020/0135426 A1 Apr. 30, 2020

(30) Foreign Application Priority Data

Oct. 25, 2018 (EP) .................................... 18202722

(51) Int. Cl.
*H01J 37/20* (2006.01)
*H01J 37/244* (2006.01)

(52) U.S. Cl.
CPC ............ *H01J 37/20* (2013.01); *H01J 37/244* (2013.01); *H01J 2237/20207* (2013.01); *H01J 2237/20278* (2013.01); *H01J 2237/24475* (2013.01)

(58) Field of Classification Search
USPC ......................................................... 250/307
See application file for complete search history.

(56) References Cited

U.S. PATENT DOCUMENTS

| | | | | |
|---|---|---|---|---|
| 2,913,584 A | * | 11/1959 | Dill | G01J 3/30 250/205 |
| 3,629,579 A | * | 12/1971 | Naitou | H01J 37/244 250/310 |
| 4,962,306 A | * | 10/1990 | Hodgson | H01J 37/244 250/305 |
| 5,109,724 A | * | 5/1992 | Delarue | B25J 7/00 475/9 |
| 9,557,280 B2 | * | 1/2017 | Pfeiffer | G01N 23/046 |
| 9,768,003 B2 | * | 9/2017 | Deerberg | H01J 49/025 |
| 9,905,394 B1 | * | 2/2018 | Bhattiprolu | H01J 37/28 |
| 10,328,285 B2 | * | 6/2019 | Beekman | A61N 5/1067 |
| 2012/0326030 A1 | | 12/2012 | Benner et al. | |
| 2013/0146765 A1 | | 6/2013 | Kitayama et al. | |
| 2015/0214004 A1 | | 7/2015 | Pavia | |

FOREIGN PATENT DOCUMENTS

| | | |
|---|---|---|
| JP | 2007200573 A | 8/2007 |
| WO | 2017104186 A1 | 6/2017 |

* cited by examiner

*Primary Examiner* — Phillip A Johnston
(74) *Attorney, Agent, or Firm* — Fox Rothschild LLP

(57) ABSTRACT

The present invention refers to an apparatus (100) and a method for detecting characteristics of a probe. In an embodiment, the apparatus (100) comprises a vacuum chamber (104) and a beam generator (102) adapted to generate a beam of charged particles within the vacuum chamber (104). When the beam of charged particles falls onto the probe, interaction particles and/or interaction radiation are generated. The apparatus (100) further comprises an electromechanical unit (114) within the vacuum chamber (104) and a detector (110) comprising a plurality of detection units and being arranged on the electromechanical unit (114) allowing for the detector (110) to move from a first position (302) with respect to the beam generator (102) to a second position (304) with respect to the beam generator (102) and vice versa, upon a corresponding actuation of the electromechanical unit (114) performable from outside of the vacuum chamber (104).

12 Claims, 6 Drawing Sheets

MOVEABLE DETECTOR

The present invention relates to a movable detector for detecting characteristics of a probe. Moreover, the present invention relates to an electron microscope (EM) comprising the movable detector, wherein the movable detector performs electron backscatter diffraction (EBSD) measurements and transmission Kikuchi diffraction (TKD) measurements.

TECHNOLOGICAL BACKGROUND AND PRIOR ART

An electron microscope is typically used for detecting/analyzing characteristics of a material or probe using a beam of electrons. In the electron microscope, the beam of electrons is made to fall onto a surface of a probe within a vacuum chamber, which creates interaction particles and/or interaction radiation within the vacuum chamber of the electron microscope. These interaction particles and/or interaction radiation are detected by various detectors in order to detect the characteristics of the probe. In an example, the detector may be used to detect crystalline properties, such as a crystal orientation (with sub-micron spatial resolution) of a crystalline material.

There are different measurement methods, such as electron backscatter diffraction (EBSD) and transmission Kikuchi diffraction (TKD) through which the characteristics of the probe can be detected. In EBSD, which is also referred to backscatter Kikuchi diffraction (BKD), diffracted backscattered electrons, generated by the interaction between the beam of electrons and the probe, are detected by an EBSD detector. When the backscattered electrons strike a phosphorus screen of the EBSD detector, a light is produced. This light is detected by a charge-coupled device (CCD) or complementary metal-oxide-semiconductor (CMOS) camera of the EBSD detector and sent to a computer in a digitized form for further analysis. In this manner, a representation of the microstructure of the probe is formed using the EBSD method. One of the main advantages of the EBSD method is that a correlation between local texture (crystal orientation distribution) and microstructure can be made. Furthermore, based on measurements obtained through the EBSD method, a grain boundary and a grain size quantitative analysis can be easily performed.

Further, the same EBSD detector can be used to perform measurements though the TKD method. The TKD is also referred to as transmission electron backscatter diffraction (t-EBSD). In the TKD method, a different sample of the probe/material is prepared. The sample used in the TKD method is an electron transparent sample and is placed above the phosphorus screen of the EBSD detector in a tilted manner. The sample is kept in such a way that the beam of electrons falls on an upper surface of the probe and transmitted scattered electrons are detected by the EBSD detector. In this manner, a diffraction pattern from a lower surface (exit surface) of the transparent probe is obtained. The TKD method provides an improved lateral spatial resolution as compared to the EBSD method by up to one order of magnitude. This probe-detector geometry, a.k.a. off-axis TKD has two major limitations though, that result in reduced measurement speed or lower quality results or both. In this geometry the detector screen is not placed in an optimum position to capture the scattered electron signal where yield is maximum and with minimized distortions. For this reason, a new probe-detector geometry has been proposed, i.e. on-axis TKD. In this special geometry, the incident beam hits the sample surface in an orthogonal manner and the detector screen is placed underneath the sample so that the optical axis of the SEM or the transmitted beam hits the middle of the screen. The on-axis TKD geometry allows capturing the scattered electron signal where is strongest, i.e. around the optical axis of the SEM and with minimized gnomonic projection distortions leading to significantly improved data acquisition speeds and data quality.

Therefore, even though the same EBSD detector can be used for both the methods, EBSD and TKD, a different arrangement/alignment of the EBSD detector is required for each of the methods and a different sample of the probe suitable for the EBSD or TKD method is required. In one conventional approach, an electron microscope is used with multiple detectors, in which some of the detectors are used for the EBSD method and some of the detectors are used for the TKD method. In such a conventional approach, the sample is replaced for each of the methods by using an airlock mechanism in the electron microscope so that a vacuum inside a vacuum chamber is maintained.

In another conventional approach, an electron microscope with a single EBSD detector is used to perform measurements through both the methods. However, an arrangement/alignment of the EBSD detector is adjusted manually for each of the methods. In such a conventional approach, one needs to vent out the vacuum chamber every time to adjust the configuration of the EBSD detector for a particular measurement method, which is very time consuming and may affect the vacuum chamber cleanliness.

The intention of this invention disclosed herein is therefore to provide an electron microscope with an electromechanical unit that uses a single detector for both the measurement methods and in which an alignment/arrangement of the detector can be adjusted according to requirements of an optimal measurement method without having to vent the vacuum chamber inside the electron microscope.

SUMMARY

In order to solve the aforementioned technical problem, there is provided an apparatus and a method for detecting characteristics of a probe. The characteristics are detected by performing EBSD measurements and TKD measurements using a single detector.

In an embodiment, an apparatus for detecting characteristics of a probe is disclosed. The apparatus comprises a vacuum chamber and a beam generator adapted to generate a beam of charged particles within the vacuum chamber. When the beam of charged particles falls onto the probe, interaction particles and/or interaction radiation are generated within the vacuum chamber.

In an example, the apparatus is one of a scanning electron microscope (SEM) or a transmission electron microscope (TEM) and the charged particles are electrons. Further, the vacuum chamber may be interchangeably referred to as a chamber or an interaction chamber.

The apparatus further comprises a detector comprising a plurality of detection units. A surface on which the plurality of detection units is disposed may be referred to as an active surface or a detecting surface.

The apparatus further comprises an electromechanical unit, within the vacuum chamber, on which the detector is positioned or mounted. The electromechanical unit is configured to allow the detector to move from a first position with respect to the beam generator to a second position with respect to the beam generator and vice versa. The electromechanical unit moves/adjusts the detector to the first position or to the second position upon a corresponding actuation of the electromechanical unit performable from outside of the vacuum chamber. In an example, the first position and the second position may also be defined with respect to a beam axis along which the beam of charged particles is generated.

Preferably, the detector is configured to perform a first measurement method in the first position and to perform a second measurement method in the second position. In an example, the first measurement method is electron backscattered diffraction (EBSD) and the second measurement method corresponds to transmission Kikuchi diffraction (TKD).

In an exemplary embodiment, in the first position, an active surface of the detector is substantially parallel to the beam axis along which the beam of charged particles is generated. The active surface may be understood as a surface of the detector on which the plurality of detecting units is disposed. Further, an alignment of the detector in the first position may also depend on an alignment of the probe. In an example, for the first measurement method, the detector is aligned in such a way that the active surface of the detector is at a predefined angle with respect to a probe surface and is substantially parallel to the beam axis. The predefined angle may range from 10 to 30 degrees with respect to the probe.

In the second position, the active surface of the detector is substantially perpendicular to a beam axis along which the beam of charged particles is generated. In an example, for the second measurement method, the detector is aligned in such a way that the active surface of the detector is substantially parallel to the probe surface.

Preferably, an alignment and/or a height of the detector within the vacuum chamber may be recalibrated based on a position and/or a height of the probe.

Preferably, the electromechanical unit of the apparatus comprises a tilting unit and a drive system connected to the tilting unit. The electromechanical unit further comprises a power source connected to the drive system and an actuation interface positioned outside of the vacuum chamber. In an example, the electromechanical unit is adapted to operate the tilting unit and to tilt the detector mounted on the tilting unit within a predefined angle upon an actuation of the electromechanical unit via the actuation interface. The predefined angle between the first position of the detector and the second position of the detector may be set to 90 degrees.

In another embodiment, a method for detecting characteristics of a probe is disclosed. The method comprises generating, by a beam generator, a first beam of charged particles within a vacuum chamber. When the first beam of charged particles falls onto the probe, interaction particles and/or interaction radiation is generated. The method further comprises detecting, by the detector in a first position, the interaction particles and/or interaction radiation to perform a first measurement method. The method further comprises moving, by an electromechanical unit, the detector from the first position to a second position upon a corresponding actuation of the electromechanical unit performable from outside of the vacuum chamber.

Before performing a second measurement method in the second position, one may need to replace a sample of the probe and adjust an alignment of the probe as per requirements of the second measurement method.

Preferably, the method further comprises generating, by the beam generator, a second beam of charged particles within the vacuum chamber. The method further comprises performing, by the detector in the second position, a second measurement method when the second beam of charged particles falls onto the probe, wherein the first measurement method is different from the second measurement method.

Preferably, the first measurement method corresponds to electron backscattered diffraction, EBSD, and the second measurement method corresponds to on-axis transmission Kikuchi TKD.

Preferably, in the first position, an active surface of the detector is substantially parallel to and away from the beam axis along which the first beam of charged particles is generated. When the detector is adjusted to the second position from the first position, the active surface of the detector is substantially perpendicular to and placed into the beam axis along which the second beam of charged particles is generated.

In another embodiment, a computer readable medium (CRM) is disclosed. The CRM comprises program instructions, which can be loaded into a processor and which, when executed, perform operations comprising generating a first beam of charged particles within a vacuum chamber. The operations further comprise detecting, when a detector is in a first position, interaction particles and/or interaction radiation generated when the beam of charged particles falls onto a probe to perform a first measurement method. The operations further comprise moving or adjusting the detector from the first position to a second position upon a corresponding actuation of the electromechanical unit performable from outside of the vacuum chamber. The operations further comprise generating a second beam of charged particles within the vacuum chamber. The operations further comprise performing a second measurement method when the second beam of charged particles falls onto the probe and the detector is in the second position. Further, the first measurement method is different from the second measurement method.

In an example, the first measurement method corresponds to electron backscattered diffraction, EBSD, measurements and the second measurement method corresponds to transmission Kikuchi diffraction, TKD, measurements.

It may be noted that the first measurement method and the second measurement may be performed in any order without deviating from the scope of the present subject matter.

In an embodiment, it is provided an apparatus for detecting characteristics of a probe. The apparatus comprises a vacuum chamber and a beam generator adapted to generate a beam of charged particles within the vacuum chamber. Interaction particles and/or interaction radiations are generated when the beam of charged particles falls onto the probe. The apparatus further comprises an electromechanical unit within the vacuum chamber and a detector comprising a plurality of detection units and being arranged on the electromechanical unit. The electromechanical unit allowing for the detector to move from a first position with respect to the beam generator to a second position with respect to the beam generator and vice versa, upon a corresponding actuation of the electromechanical unit performable from outside of the vacuum chamber.

The apparatus allows for performing different measurement methods that require different alignments/positions using a single detector. Furthermore, with the apparatus of the present invention, there is no need to vent the vacuum chamber to adjust the alignment/position of the detector as the actuation to change the alignment/position of the detector can be performed from outside the vacuum chamber.

Preferably, the detector is configured to perform a first measurement method in the first position and to perform a second measurement method in the second position. The second measurement method is different from the first measurement method. Since the detector of the apparatus can be arranged in different positions, measurement methods that require a different alignment or position of the detector can be easily performed using the apparatus.

Preferably, the first measurement method corresponds to electron backscattered diffraction, EBSD. The EBSD provides measurement data in order to determine characteristics of the probe, such as a crystalline structure and orientation in a solid crystalline phase.

Preferably, the second measurement method corresponds to transmission Kikuchi diffraction, TKD. The TKD provides measurement data with high spatial resolution performance which makes it ideal for quantitative characterization of nanomaterials or ultrafine grained materials with crystal/particle sizes smaller than 100 nm.

According to a preferred embodiment, the electromechanical unit comprises a tilting unit and a drive system connected to the tilting unit. The electromechanical unit further comprises a power source connected to the drive system and an actuation interface positioned outside of the vacuum chamber. The detector is positioned on the tilting unit and the electromechanical unit is adapted to operate the tilting unit and to tilt the detector within a predefined angle with respect to the beam generator upon the actuation of the electromechanical unit via the actuation interface.

The electromechanical unit allows the detector to be actuated from outside the vacuum chamber by simply using the actuation interface. With the electromechanical unit, an operator can easily control the detector via the actuation interface.

Preferably, in the first position, an active surface of the detector is substantially parallel to a beam axis along which the beam of charged particles is generated. The arrangement of the detector in the first position allows for detection of diffracted electrons in order to perform the EBSD measurements accurately.

Preferably, in the second position, an active surface of the detector is substantially perpendicular to a beam axis along which the beam of charged particles is generated. The arrangement of the detector in the second position allows for detection of electrons that are transmitted through an electron-transparent sample in order to perform the TKD measurements accurately.

In a preferred embodiment, in the second position, the active surface of the detector is substantially parallel with the probe surface. A probe-detector geometry/alignment ensures that most of the transmitted electrons fall onto the active surface of the detector.

In a preferred embodiment, an alignment and/or a height of the detector within the vacuum chamber are recalibrated based on a position and/or height of the probe. The recalibration of the alignment and/or the height of the detector ensure that any deviation caused in the arrangement of various components of the apparatus due to wear and tear of the apparatus is adjusted before performing the measurement methods.

Preferably, the apparatus is one of a scanning electron microscope, SEM, and a transmission electron microscope, TEM. The arrangement of the various components is such that it can be easily implemented in a SEM or a TEM in order to determine characteristics of a probe.

In another embodiment, it is provided a method for detecting characteristics of a probe. The method comprises generating, by a beam generator, a first beam of charged particles within a vacuum chamber. Interaction particles and/or interaction radiation are generated when the first beam of charged particles falls onto the probe. The method further comprises detecting, by the detector in a first position, the interaction particles and/or interaction radiation to perform a first measurement method and moving, by an electromechanical unit, the detector from the first position to a second position upon a corresponding actuation of an electromechanical unit performable from outside of the vacuum chamber.

The method provides for performing different measurement methods that require different alignments/positions using a single detector. Furthermore, the method ensures the alignment/position of the detector can be adjusted from outside the vacuum chamber so that there is no need to vent the vacuum chamber which reduces the risks of chamber contamination and saves significant amounts of time when switching between the two different measurement methods.

Preferably, the method further comprises generating, by the beam generator, a second beam of charged particles within the vacuum chamber and performing, by the detector in the second position, a second measurement method when the second beam of charged particles falls onto the probe. The, first measurement method is different from the second measurement method. Since the detector can be adjusted in different positions, various measurement methods that require a different position or alignment can be performed using a single detector.

Preferably, the first measurement method corresponds to electron backscattered diffraction, EBSD, and the second measurement method corresponds to transmission Kikuchi TKD. The EBSD provides measurement data in order to determine characteristics of the probe, such as a crystalline structure and orientation in a solid crystalline phase and the TKD provides measurement data with high spatial resolution performance which makes it ideal for quantitative characterization of nanomaterials or ultrafine grained materials with crystal/particle sizes smaller than 100 nm.

In a preferred embodiment, in the first position, an active surface of the detector is substantially parallel to a beam axis along which the first beam of charged particles is generated; and in the second position, the active surface of the detector is substantially perpendicular to the beam axis along which the second beam of charged particles is generated.

The arrangement of the detector in the first position allows for detection of diffracted electrons in order to perform the EBSD measurements accurately and the arrangement of the detector in the second position allows for detection of electrons that are transmitted through an electron-transparent sample in order to perform the TKD measurements accurately.

In another embodiment, it is provided a computer-readable storage medium comprising instructions, which can be loaded into a processor and which, when executed, cause the processor to perform the method for detecting characteristics of a probe. The computer-readable storage medium allows an operator to perform an actuation from outside the vacuum chamber to adjust a position of the detector so that there is no need to vent the vacuum chamber and various measurement methods can be performed using a single detector, which saves a lot of time and resources.

Further aspect of the invention can be learned from the claims and the description.

DETAILED DESCRIPTION OF THE INVENTION

Figure 1:
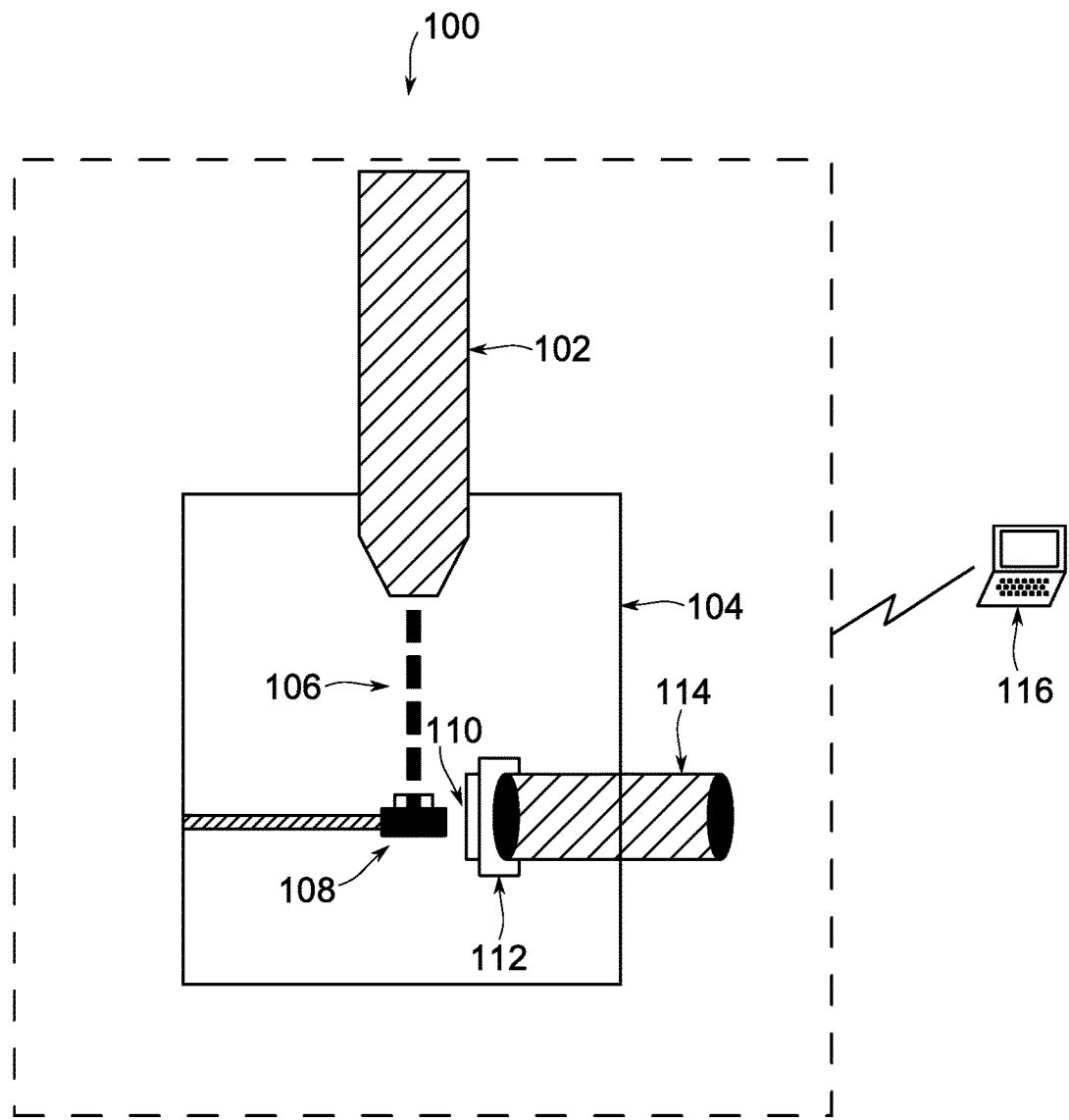
FIG. 1 illustrates an apparatus for detecting characteristics of a probe, in accordance with an embodiment of the present subject matter.

Reference will now be made in detail to embodiments, examples of which are illustrated in the accompanying drawings. Effects and features of the exemplary embodiments, and implementation methods thereof will be described with reference to the accompanying drawings. In the drawings, like reference numerals denote like elements, and redundant descriptions are omitted. As used herein, the term "and/or" includes any and all combinations of one or more of the associated listed items. Further, the use of "may" when describing embodiments of the present invention refers to "one or more embodiments of the present invention."

It will be understood that although the terms "first" and "second" are used to describe various elements, these elements should not be limited by these terms. These terms are only used to distinguish one element from another element Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures.

FIG. 1 illustrates an apparatus 100 for detecting characteristics of a probe, in accordance with an embodiment of the present subject matter. As shown in FIG. 1, the apparatus 100 comprises a beam generator 102 and a vacuum chamber 104. The beam generator 102 is adapted to generate a beam of charged particles within the vacuum chamber 104. The beam of charged particles is generated along a beam axis 106 so that the beam of charge particles falls onto the probe. The apparatus 100 further comprises a sample holder 108 on which the probe is positioned or placed.

When the beam of charged particles falls onto the probe, interaction particles and/or interaction radiation are generated within the vacuum chamber 104. The apparatus 100 comprises a detector 110 having a plurality of detection units to detect the interaction particles and/or interaction radiation generated within the vacuum chamber 104. As shown in FIG. 1, the detector 110 is mounted or positioned on a tilting unit 112 of an electromechanical unit 114, which is controlled from outside of the vacuum chamber 104.

Preferably, the apparatus 100 is a scanning electron microscope (SEM) and the beam generator 102 generates a beam of electrons. When the beam of electrons falls onto a surface of the probe, backscattered electrons are generated. Subsequently, the backscattered electrons are detected by the detector 110. The detector 110 comprises a plurality of detection units. A surface on which the plurality of detection units is disposed may be referred to as an active surface 202 or a detecting surface 202 (shown in FIG. 2). The backscattered electrons are detected by the active surface 202 and then the detection of the backscattered electrons is reported to a device 116 for analyzing characteristics of the probe. In an example, information received from the detector 110 may be used to analyze a structure, a crystal orientation and a phase of the probe.

In an example, the detector 110 is electron backscattered diffraction (EBSD) detector. The same detector 110 may be used to preform different measurements according to various measurement methods in order to detect characteristics of the probe.

In said embodiment, the detector 110 may perform a first measurement method in a first position with respected to the beam generator 102 and may perform a second measurement method in a second position with respect to the beam generator 102. It may be noted that the position of the detector 110 may also be adjusted based on an alignment of the probe in addition to the beam generator 102. The first position and the second position for performing the first measurement method and the second measurement method, respectively, are discussed in detail in conjunction with FIGS. 4(b) and 5(b).

Figure 2:
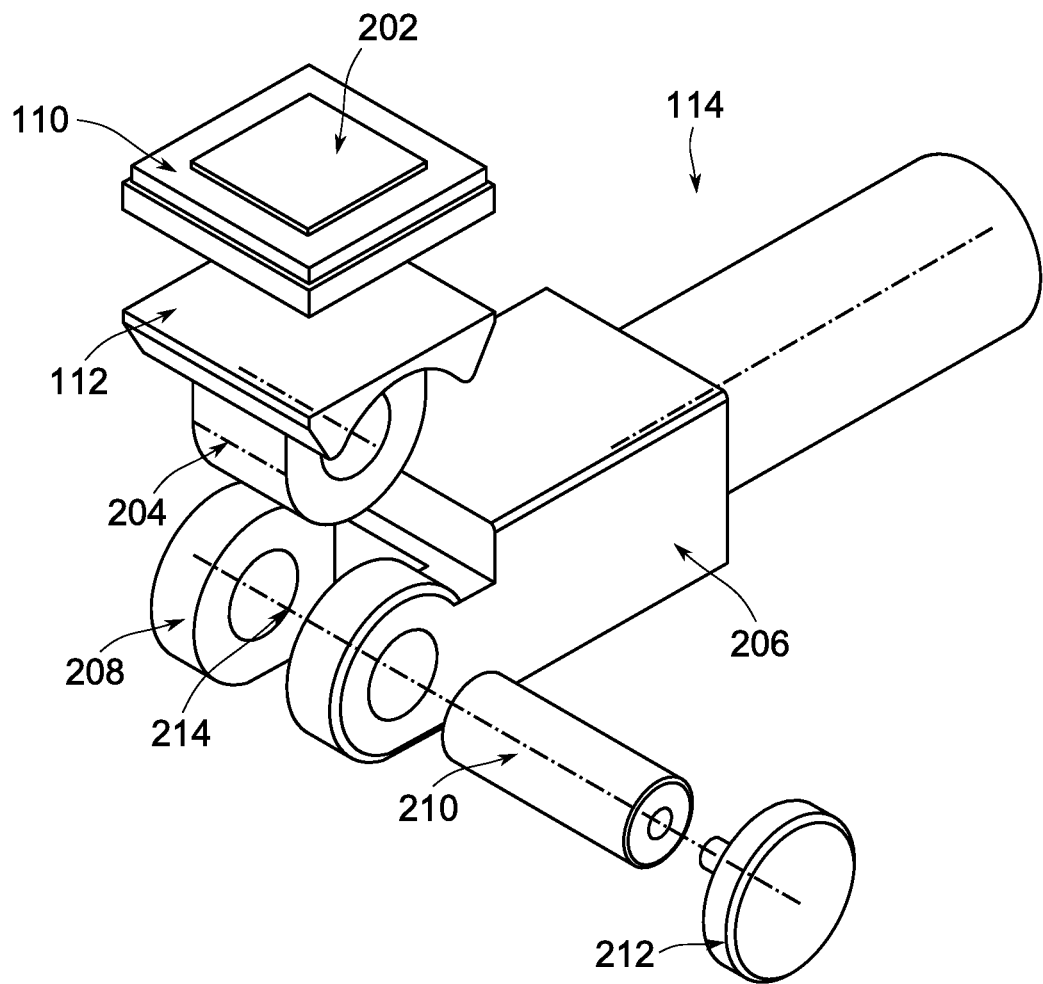
FIG. 2 illustrates components of an electromechanical unit, in accordance with an embodiment of the present subject matter.

FIG. 2 illustrates components of the electromechanical unit 114, in accordance with an embodiment of the present subject matter. As shown in FIG. 2, the electromechanical unit 114 comprises the tilting unit 112 adapted to hold the detector 110 or parts of the detector 110. An upper surface of the detector 110 on which the plurality of detecting units is disposed may be referred to as an active surface 202 or a detecting surface 202. An upper side of the tilting unit 112 is adapted to hold the detector 110 and a first connecting member 204 is provided on a lower side of the tilting unit 112. The upper side of the tilting unit 112 is opposite to the lower side of the tilting unit 112.

The electromechanical unit 114 further comprises a main body 206 which has a second connecting member 208 on one end, as shown in FIG. 2. The first connecting member 204 and the second connecting member 208 are coupled to each other through a coupling member 210 such that a hinge joint is formed in the electromechanical unit 114. The hinge joint allows for the tilting unit 112 to move from one position to another upon actuation. As shown in FIG. 2, the hinge joint formed by the arrangement of the first connecting member 204, the second connecting member 208, and the coupling member 206 allows for the tilting unit 112 to move along a rotational axis 214 and go from one position to another. The electromechanical unit 114 further comprises a fixing unit 212 to fixedly couple the first connecting member 204 and the second connecting member 208 through the coupling member 210.

Preferably, the electromechanical unit 114 may comprise a drive system connected to the tilting unit 112 and a power source connected to the drive system (not shown in figures). The drive system and the power source may drive the tilting unit 112 upon an actuation. The electromechanical unit 114 may further comprise an actuation interface positioned outside of the vacuum chamber 104. The actuation interface may be controlled by an operator operating the apparatus 100 through the device 116.

In an example, to perform the first measurement method and/or the second measurement, the actuation may be sent via the actuation interface to adjust the tilting unit 112 or the detector 110 to a position suitable for the measurement method. In another example, the actuation interface may calibrate the position of the tilting unit 112 with respect to the beam axis 106 and/or an alignment of the probe in order to take measurements accurately. In addition to the position or alignment of the tilting unit 112, the actuation interface may recalibrate or adjust a height of the detector based on a height or a position of the probe.

It may be noted that different types of mechanism may be used to allow for the tilting 112 to move from one position to another. For example, the tilting unit 112 may be electrically, mechanically or hydraulically operated without deviating from the scope of the invention.

Figure 3:
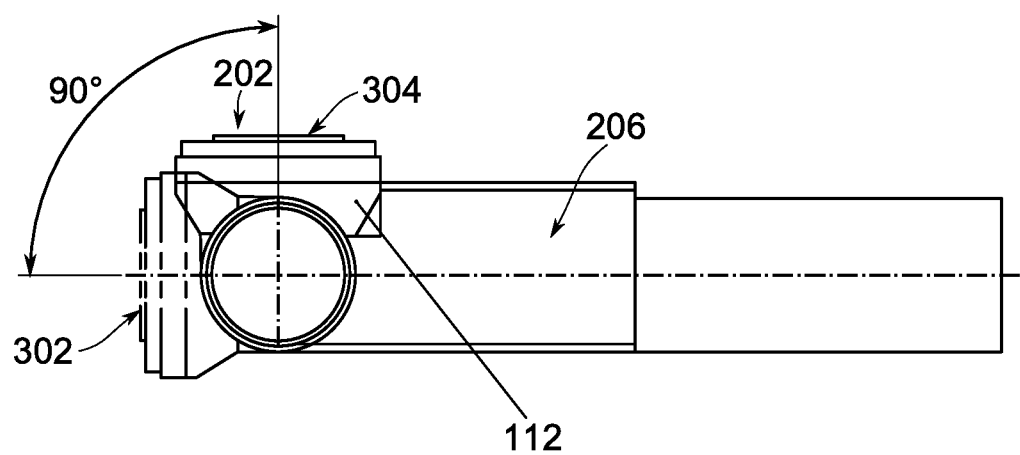
FIG. 3 illustrates a movement of a detector mounted on an electromechanical unit, in accordance with an embodiment of the present subject matter.

FIG. 3 illustrates a movement of the detector 110 mounted on the electromechanical unit 114, in accordance with an embodiment of the present subject matter. As shown in FIG. 3, the tilting unit 112 is in a second position 304 in which the active surface 202 of the detector 110 is horizontally aligned. The tilting unit 112 is adapted to move the detector 110 by 90 degrees to the first position. In the first position, the active surface 202 of the detector 110 is vertically aligned. It may be noted that the movement of the tilting unit 112 illustrated herein is exemplary and a degree of movement may also vary depending upon a position of the probe. In an example, there is a predefined angle between the first position 302 and the second position 304. Further, both the positions, the first position 302 and the second position 304, are stabile positions.

Figure 4A:
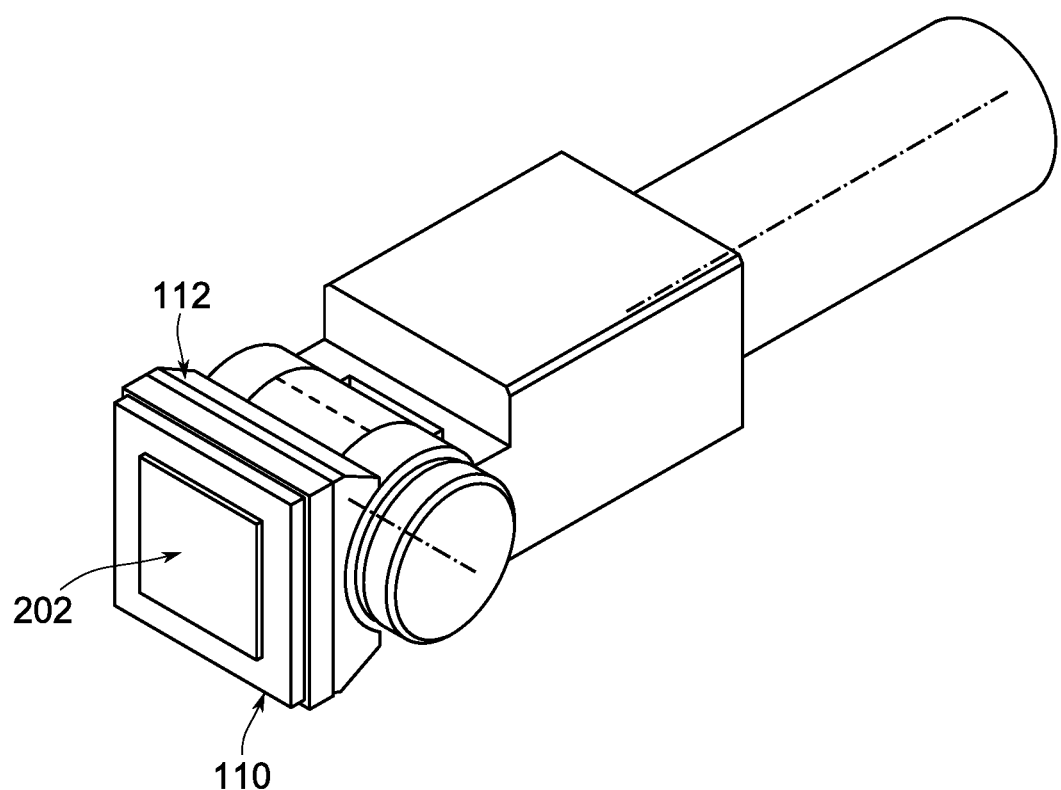
FIGS. 4(a) and 4(b) illustrates an alignment of a detector mounted on an electromechanical unit for a first measurement method, in accordance with an embodiment of the present subject matter.
Figure 4B:
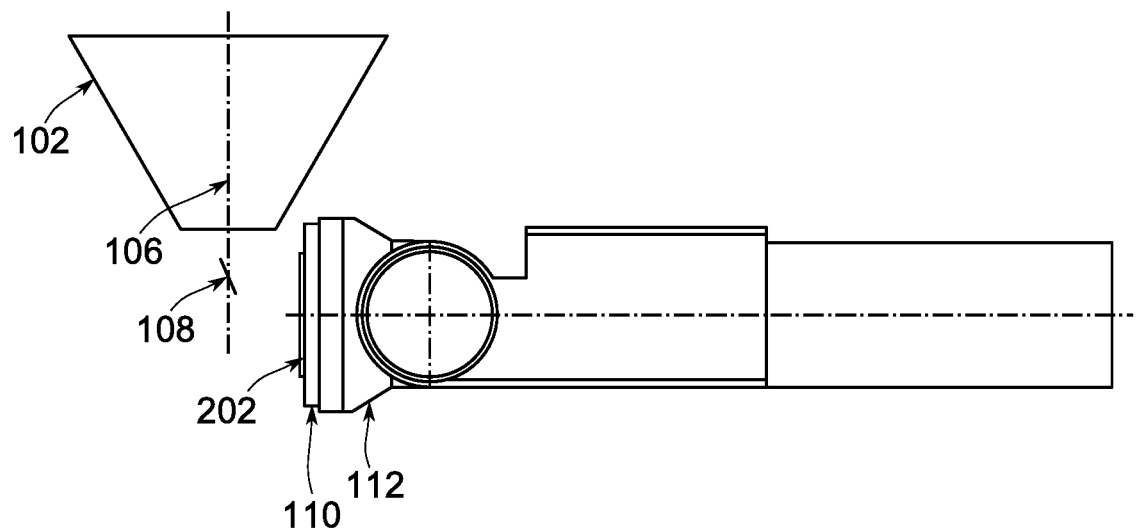

FIGS. 4(a) and 4(b) illustrates an alignment of the detector 110 mounted on the electromechanical unit 114 for the first measurement method, in accordance with an embodiment of the present subject matter. As shown in FIG. 4(a), the tilting unit 112 is in the first position in which the active surface 202 of the detector 110 is vertically aligned. In an example, the first measurement method corresponds to electron backscattered diffraction (EBSD).

FIG. 4(b) depicts the first position of the detector 110, mounted on the tilting unit 112, with respect to the sample/probe and the beam axis 106 along which the beam of charged particles is generated to fall onto the probe. As shown in FIG. 4(a), the active surface 202 of the detector 110 is substantially parallel to the beam axis 106. In operation, to perform the first measurement method, the operator may send instructions to the actuation interface through the device 116 to align/adjust the tilting unit 112 in the first position 302, if the detector 110 is not already aligned to the first position 302. Once the titling unit 112 and the detector 110 mounted on the tilting unit 112 are aligned in the first position 302, the beam generator 102 may generate a beam of electrons along the beam axis 106. Thereafter, the beam of electrons falls onto a surface of the probe and backscattered electron are generated. These backscattered electrons are detected by the detector 110 and images received upon detection of the backscattered electrons are sent to the device 116 for analysis. In this manner, the first measurement method, EBDS, is performed using the detector 110 in the first position 302.

Subsequently, to perform the second measurement method, the operator needs to adjust the position of the detector 110 and change a sample of the probe placed in the sample holder 108. In an example, the second measurement method corresponds to transmission Kikuchi diffraction (TKD). For TKD, an electron transparent sample of the probe is needed. In an example, a TEM lamella, a free standing film, a crystalline nanoparticle of the probe may be used for the TKD measurements. Further, the sample needs to be aligned in such a way that most of the transmitted electrons fall onto the active surface 202 of the detector 110.

The operator may replace the sample of the probe as per requirements of the TKD method using an airlock mechanism provided for in the apparatus 100 so the vacuum inside the vacuum chamber 104 is maintained. Further, the same detector 110 is used for the second measurement method, a position or an alignment of the detector 110 is adjusted from outside the vacuum chamber 104 through an actuation received from the actuation interface.

Figure 5A:
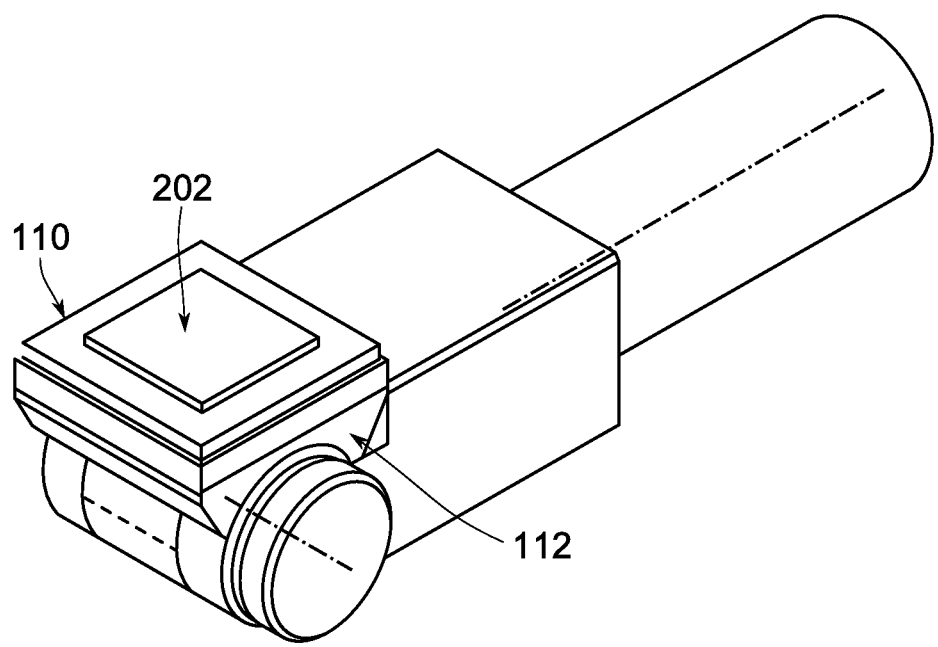
FIGS. 5(a) and 5(b) illustrates an alignment of a detector mounted on an electromechanical unit for a second measurement method, in accordance with an embodiment of the present subject matter.
Figure 5B:
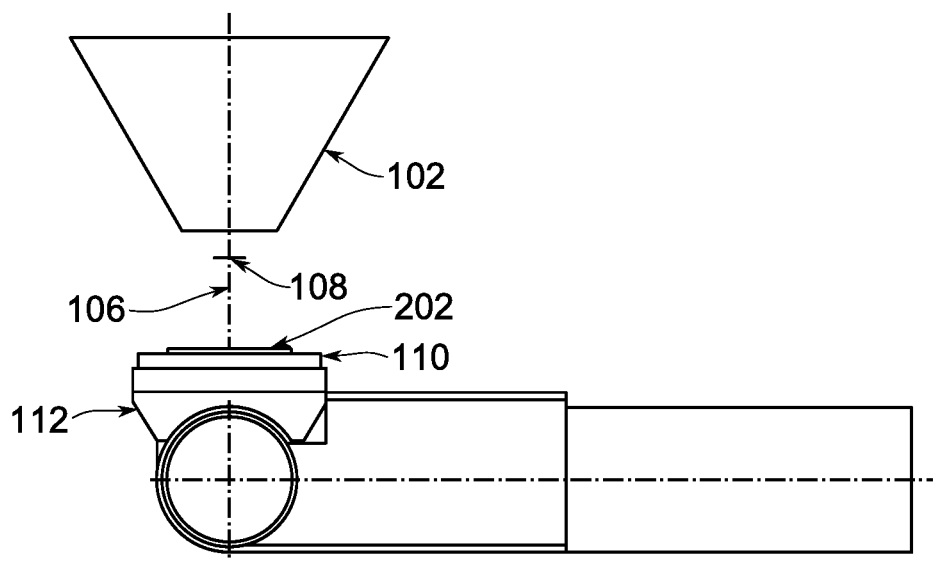

FIGS. 5(a) and 5(b) illustrates an alignment of the detector 110 mounted on the electromechanical unit 114 for the second measurement method, in accordance with an embodiment of the present subject matter. As shown in FIG. 5(a), the tilting unit 112 is in the second position 304 in which the active surface 202 of the detector 110 is horizontally aligned.

FIG. 5(b) depicts the detector 110 in the second position 304 in which the active surface 202 of the detector 110 is substantially perpendicular to the beam axis 106. In operation, to perform the second measurement method, the operator may determine whether or not the detector 110 is in the second position 304. If the operator is performing the second measurement method right after the first measurement method, the operator may instruct the actuation interface to adjust or move the tilting unit 112 to the second position 304. Further, the operator may need to use an electron transparent sample of the probe for the second measurement method. Also, the operator may need to adjust an alignment of the sample using the sample holder 108 so that there is a predefined angle between the sample and the detector 110.

Once the detector 110 is adjusted to the second position for the second measurement method, the beam generator 102 may generate the beam of electrons along the beam axis 106 to fall on the electron transparent sample of the probe. Thereafter, electrons transmitted through a lower surface of the sample, referred to as transmitted electrons, are detected by the detector 110 which is horizontally positioned in the second position 304 underneath the sample. Subsequently, the detector 110 may send detected images based on the transmitted electrons to the device 116 for further analysis. In this manner, the same detector 110 in the second position 304 is used to perform the second measurement method.

Thus, the apparatus 100 of the present subject matter allows a single detector 110 to perform the first measurement method and the second measurement method. Further, since the position of the detector 110 is adjusted from outside the vacuum chamber 104, there is no need to vent the vacuum chamber 104 for changing the position of the detector 110.

Figure 6:
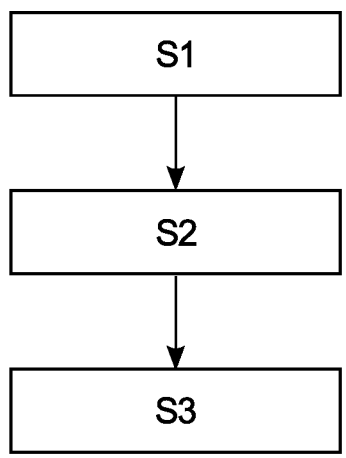
FIG. 6 illustrates an exemplary method for detecting characteristics of a probe, in accordance with an embodiment of the present subject matter.

FIG. 6 illustrates an exemplary method for detecting characteristics of a probe, in accordance with an embodiment of the present subject matter. The order in which the method is described is not intended to be construed as a limitation, and any number of the described method blocks can be combined in any order to implement the method or alternative methods.

In step S1, to detect and analyze the characteristics of the probe or material, a first beam of charged particles is generated by the beam generator 102 along the beam axis 106 so that the beam of charged particles fall onto the probe. When the beam charged particles falls onto the probe, interaction particles and/or interaction radiation are generated within the vacuum chamber. In an example, the beam generator 102 may generate a first beam of electrons that falls onto a surface of the probe. When the first beam of electrons falls onto the surface of the probe, backscattered electrons are generated within the vacuum chamber 104.

In step S2, the interaction particles and/or interaction radiations are detected by the detector 110 in the first position 302 to perform a first measurement method. In an example, the first measurement method corresponds to electron backscattered diffraction (EBSD). The backscattered electrons within the vacuum chamber 104 hit the active surface 202 of the detector 110 and the detected signal may be then sent to the device 116 in a digitized form.

Preferably, in the first position 302, the active surface 202 of the detector 110 is aligned substantially parallel to the beam axis 106. It may be noted that an alignment of the detector 110 may also vary depending on an alignment of the probe. In an example, for the first measurement method, the detector 110 may be aligned in such a way that the angle between the active surface 202 and the sample/probe surface may range from 10 to 30 degrees.

In step S3, the detector 110 is moved from the first position 302 to a second position 304 to perform a second measurement method upon a corresponding actuation of an electromechanical unit 114 performable from outside of the vacuum chamber 104. In an example, the second measurement method corresponds to transmission Kikuchi diffraction method.

Preferably, in the second position, the active surface 202 of the detector 110 is aligned or positioned substantially perpendicular to the beam axis 106 or beam generator 102.

Further, before performing the second measurement method, the probe may be replaced with an electron transparent sample of the probe and the sample holder 108 may be aligned in such a way that the electron transparent sample or a probe surface is substantially parallel to the active surface 202 of the detector 110. Once the probe is replaced and the detector 110 is in the second position, the beam generator 102 may generate another beam (a second beam) of charged particles along the beam axis 106 which falls onto the transparent sample. In an example, a beam of electrons is generated which falls onto the transparent sample. Thereafter, electrons transmitted through a lower surface of the sample, referred to transmitted electrons, are detected by the active surface 202 of the detector 110 positioned below the transparent sample. In this manner, the second measurement method is performed by the detector positioned in the second position 304.

It should be noted that the first measurement method and the second measurement method may be performed in any order without deviating from the scope of the invention. In an example, the operator may first perform the second measurement method and then perform the first measurement method. In such an example, the detector 110 is initially positioned in the second position 304, and once the second measurement is performed, the detector 110 is moved from the second position 304 to the first position 302.

Furthermore, one or more computer-readable storage medium may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

REFERENCE NUMBERS

100 Apparatus
102 Beam Generator
104 Vacuum Chamber
106 Beam Axis
108 Sample Holder
110 Detector
112 Tilting Unit
114 Electromechanical unit
116 Device
202 Active Surface
204 First Connecting Member
206 Main body
208 Second Connecting Member
210 Coupling Member
212 Fixing Unit
214 Rotational Axis
302 First Position
304 Second Position

What is claimed is:

1. An apparatus (100) for detecting characteristics of a probe, wherein the apparatus (100) comprises:
a vacuum chamber (104),
a beam generator (102), adapted to generate a beam of charged particles within the vacuum chamber (104), wherein interaction particles and/or interaction radiation are generated when the beam of charged particles falls onto the probe;
an electromechanical unit (114) within the vacuum chamber (104);
a detector (110) comprising a plurality of detection units and being arranged on the electromechanical unit (114), wherein the electromechanical unit (114) allowing for the detector (110) to move from a first position (302) with respect to the beam generator (102) to a second position (304) with respect to the beam generator (102) and vice versa, upon a corresponding actuation of the electromechanical unit (114) performable from outside of the vacuum chamber (104),
wherein the detector (110) is configured to:
perform a first measurement method in the first position (302); and
perform a second measurement method in the second position (304), wherein the second measurement method is different from the first measurement method,
characterized in that,
in the first position (302), an active surface (202) of the detector (110) is substantially parallel to a beam axis (106) along which the beam of charged particles is generated, and
in the second position (304), the active surface (202) of the detector (110) is substantially perpendicular to the beam axis (106) and the detector (110) is horizontally positioned underneath the probe.

2. The apparatus (100) of claim 1, wherein the first measurement method corresponds to electron backscattered diffraction, EBSD.

3. The apparatus (100) of claim 1, wherein the second measurement method corresponds to transmission Kikuchi diffraction, TKD.

4. The apparatus (100) of claim 1, wherein the electromechanical unit (114) comprises a tilting unit (112);
a drive system connected to the tilting unit (112);
a power source connected to the drive system; and
an actuation interface positioned outside of the vacuum chamber (104), and wherein the detector (110) is positioned on the tilting unit (112), and
wherein the electromechanical unit (114) is adapted to operate the tilting unit (112) and to tilt the detector (110) within a predefined angle with respect to the beam generator (102) upon the actuation of the electromechanical unit (114) via the actuation interface.

5. The apparatus (100) of claim 1, wherein, in the first position (302), the active surface (202) of the detector (110) is at a predefined angle with respect to a probe surface, wherein the predefined angle substantially ranges from 10 to 30 degrees, and wherein in the second position (304), the active surface (202) of the detector (110) is substantially parallel to the probe surface.

6. The apparatus (100) of claim 1, wherein an alignment and/or a height of the detector (110) within the vacuum chamber (104) are recalibrated based on a position and/or height of the probe.

7. The apparatus of claim 1 is one of a scanning electron microscope, SEM, and a transmission electron microscope, TEM.

8. A method for detecting characteristics of a probe, wherein the method comprises:
generating, by a beam generator (102), a first beam of charged particles within a vacuum chamber (104), wherein interaction particles and/or interaction radiation are generated when the first beam of charged particles falls onto the probe;
detecting, by the detector (110) in a first position (302), the interaction particles and/or interaction radiation to perform a first measurement method;
performing a first measurement method in the first position (302), wherein in the first position (302), an active surface (202) of the detector (110) is substantially parallel to a beam axis (106) along which the beam of charged particles is generated;
moving, by an electromechanical unit (114), the detector (110) from the first position (302) to a second position (304) upon a corresponding actuation of an electromechanical unit (114) performable from outside of the vacuum chamber (104), wherein in the second position (304), the active surface (202) of the detector (110) is substantially perpendicular to the beam axis (106) and the detector (110) is horizontally positioned underneath the probe; and
performing a second measurement method in the second position (304), wherein the second measurement method is different from the first measurement method.

9. The method of claim 8 further comprises:
generating, by the beam generator (104), a second beam of charged particles within the vacuum chamber (104);
performing, by the detector (110) in the second position (304), the second measurement method when the second beam of charged particles falls onto the probe.

10. The method of claim 9, wherein the first measurement method corresponds to electron backscattered diffraction, EBSD, and the second measurement method corresponds to transmission Kikuchi diffraction TKD.

11. The method of claim 10, wherein,
in the first position (302), an active surface (202) of the detector (110) is substantially parallel to a beam axis (106) along which the first beam of charged particles is generated; and
in the second position (304), the active surface (202) of the detector (110) is substantially perpendicular to the beam axis (106) along which the second beam of charged particles is generated.

12. A computer-readable storage medium comprising instructions, which can be loaded into a processor and which, when executed, cause the processor to perform the method of claim 8.

* * * * *